United States Patent [19]

Nied

[11] Patent Number: 4,737,217

[45] Date of Patent: Apr. 12, 1988

[54] METHOD OF FABRICATING A SUBSTRATE FOR A SEMICONDUCTOR CHIP PACKAGE

[75] Inventor: Herman F. Nied, Clifton Park, N.Y.

[73] Assignee: General Electric Company, Schenectady, N.Y.

[21] Appl. No.: 866,530

[22] Filed: May 23, 1986

Related U.S. Application Data

[62] Division of Ser. No. 781,592, Sep. 30, 1985, Pat. No. 4,657,797.

[51] Int. Cl.4 ............................................. H01R 43/2
[52] U.S. Cl. ..................................... 156/193; 29/825; 156/172; 357/81
[58] Field of Search ........................ 156/193, 172, 184; 29/589, 591; 357/81; 428/64

[56] References Cited

U.S. PATENT DOCUMENTS 4,196,442  4/1980  Kuniya et al. .................... 357/81 X
4,254,548  3/1981  Arakawa et al. ................. 29/589 X Primary Examiner—David Simmons
Attorney, Agent, or Firm—William H. Steinberg; James C. Davis, Jr.; Paul R. Webb, II

[57] ABSTRACT

A substrate for a semiconductor chip package comprises a metal layer characterized by a high coefficient of thermal conductivity and girded by a restraining wrapper characterized by both a low coefficient of thermal expansion and a high ultimate tensile strength.

4 Claims, 2 Drawing Sheets

METHOD OF FABRICATING A SUBSTRATE FOR A SEMICONDUCTOR CHIP PACKAGE

This application is a division, of application Ser. No. 781,592, filed 9/30/85, now U.S. Pat. No. 4,657,797.

The present invention relates in general to a semiconductor chip package and in particular to such a package with a substrate comprising a metal layer characterized by a high coefficient of thermal conductivity and girded by a restraining wrapper characterized by both a low coefficient of thermal expansion and a high ultimate tensile strength.

BACKGROUND OF THE INVENTION

It is well known in the art of semiconductor packaging to bond a semiconductor chip to a metal substrate, such a substrate typically being selected for its high coefficient of thermal conductivity and its corresponding ability to function as a heat sink. A layer of soft solder is typically used to bond the chip to the metal substrate, thus forming a semiconductor chip package. Such a package conducts heat from the semiconductor chip through the solder layer to the metal substrate, thereby maintaining the chip at an acceptable operating temperature.

A well recognized, though undesirable phenomenon associated with this type of semiconductor chip packaging is the failure of the solder layer bond between the chip and the substrate. Such failure is due to a thermal fatigue induced in the solder layer due to a large difference in the values of the coefficient of thermal expansion for the metal substrate versus the semiconductor chip. The metal substrate, selected for its high coefficient of thermal conductivity, typically exhibits a correspondingly high coefficient of thermal expansion. A semiconductor chip, however, typically exhibits a very low coefficient of thermal expansion. Thus, when the semiconductor chip package is subjected to thermal cycling normally associated with the operation of the semiconductor chip, the metal substrate will exhibit large amounts of planar expansion and contraction, while the semiconductor chip will remain substantially the same size. During this thermal cycling, the solder layer, disposed intermediate the chip and the substrate, undergoes substantial stresses and strains. These stresses and strains cause the solder layer bond to fail, thereby eventually rendering the semiconductor chip inoperable. Much effort has recently been directed to solving this problem of thermal fatigue in the solder layer bond by altering the metallurgical properties of either the metal substrate or the solder layer bond. To date, these efforts have yielded results that are either prohibitive in cost or ineffective in solving the problem.

OBJECTS OF THE INVENTION

It is the principle object of the present invention to provide a new and improved substrate for a semiconductor chip package which does not exhibit a substantial change in planar dimensions during thermal cycling and hence which is not subject to the aforementioned problems and disadvantages.

A further object of the present invention is to provide a semiconductor chip package capable of accommodating a typical solder layer bond between the substrate and a semiconductor chip without causing thermal fatigue in said solder layer bond.

SUMMARY OF THE INVENTION

The foregoing and other objects of the invention are achieved through the use of a new and improved substrate for a semiconductor chip package. In accordance with the present invention, the substrate comprises a metal layer characterized by a high coefficient of thermal conductivity and girded by a restraining wrapper characterized by both a low coefficient of thermal expansion and a high ultimate tensile strength.

A method of making the substrate comprises the step of providing a metal bar characterized by a high coefficient of thermal conductivity. The periphery of the metal bar is girded with a restraining wrapper comprising a material characterized by both a low coefficient of thermal expansion and a high ultimate tensile strength. The wrapped bar is subsequently sliced into at least one substrate layer of a predetermined thickness, this substrate layer including a surface for bonding to the chip.

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing figures, in which like reference numerals are carried forward, and in which:

DETAILED DESCRIPTION OF THE INVENTION

Figure 1:
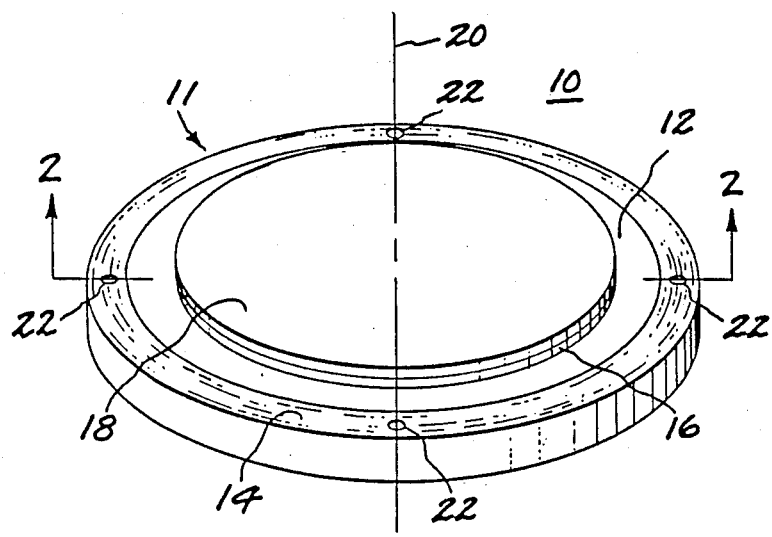
FIG. 1 comprises a perspective view of a semiconductor chip package including a substrate constructed in accordance with the present invention.

Referring now to the drawings, FIG. 1 shows a semiconductor chip package 10 including a substrate 11 comprising a metal layer or disc 12 girded by an annular restraining wrapper 14. A layer 16 of soft solder is disposed between a surface of disc 12 and a semiconductor chip 18 for bonding the chip to the disc. Layer 16 and chip IS are each generally round, and coaxially disposed with disc 12 about an axis 20. Holes 22 are optionally incorporated in wrapper 14 to aid in securing package IO to an external mount (not shown). In accordance with the present invention, disc 12 is characterized by a high coefficient of thermal conductivity which, as will be appreciated by those skilled in the art, is typically accompanied by a high coefficient of thermal expansion. In the preferred embodiment of the invention, illustrated and described herein, disc 12 comprises copper (Cu). Disc 12 could, for example, alternatively comprise silver (Ag). Wrapper 14 is characterized by a material having both a low coefficient of thermal expansion and a high ultimate tensile strength. Further, wrapper 14 may beneficially be selected to comprise material which is light in weight. In the preferred embodiment of the invention, the material comprising wrapper 14 is a carbon fiber-epoxy composite. Wrapper 14, could, for example, alternatively comprise boron fiber-epoxy composite. In the preferred embodiment of the invention chip 18 is selected to be silicon (Si). Chip 18 could, however, be selected to be any other semiconductor material used to fabricate integrated circuits as, for example gallium arsenide (GaAs). Finally, solder layer 16, while typically comprising a soft solder, can comprise any one of many commercially available hard or soft solders suitable for bonding silicon to copper.

Figure 2:
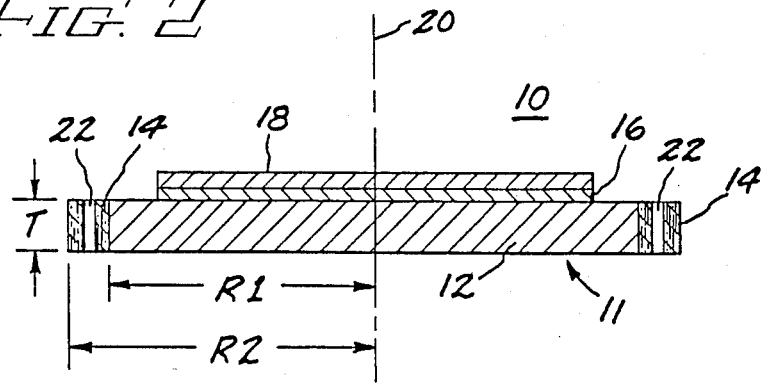
FIG. 2 is a cross-sectional view taken along line 2—2 of FIG. 1.

FIG. 2 illustrates exemplary dimensions for substrate 11. In the preferred embodiment of the invention, the radius R1 of disc 12 is selected to be approximately $25.4 \times 10^{-3}$ meters. The radius R2 including disc 12 and wrapper 14 is selected to be approximately $35.4 \times 10^{-3}$ meters. The thickness T of disc 12 and wrapper 14 is selected to be approximately $5 \times 10^{-3}$ meters.

In operation, when package 10 is submitted to thermal cycling, wrapper 14 constrains much of the planar expansion normally exhibited by disc 12, thus preventing the fatigue and eventual failure of solder layer 16 in the manner described hereinabove. Calculations show that, using a typical carbon fiber-epoxy composite having a coefficient of thermal expansion $\alpha \approx 0$, an elastic modulus of $E = 20 \times 10^4$ MPa, a Poisson's ratio of $\gamma = 0.25$ and an ultimate tensile strength of $\sigma = 1,400$ MPa, the strain (strain being defined as change in length divided by original length) exhibited in disc 12 due to a thermal cycle of approximately 100° C. is 26% less than the strain exhibited by an unrestrained copper disc (not shown). This reduction in the strain results in a radial compressive stress of 74.9 MPa acting in the plane of disc 12. which in turn produces a maximum circumferential stress of 233.9 MPa in wrapper 14. The circumferential stress induced in wrapper 14 as a result of the thermal cycling is thus seen to be well within the ultimate tensile strength of the wrapper.

It will be appreciated by those skilled in the art that the generation of the compressive stresses described hereinabove may result in some warpage of disc 12. This warpage can be minimized by a careful selection of the dimensions and materials selected for substrate 11. In particular, increasing thickness T of disc 12 and wrapper 14 will reduce warping of the disc.

Figure 3:
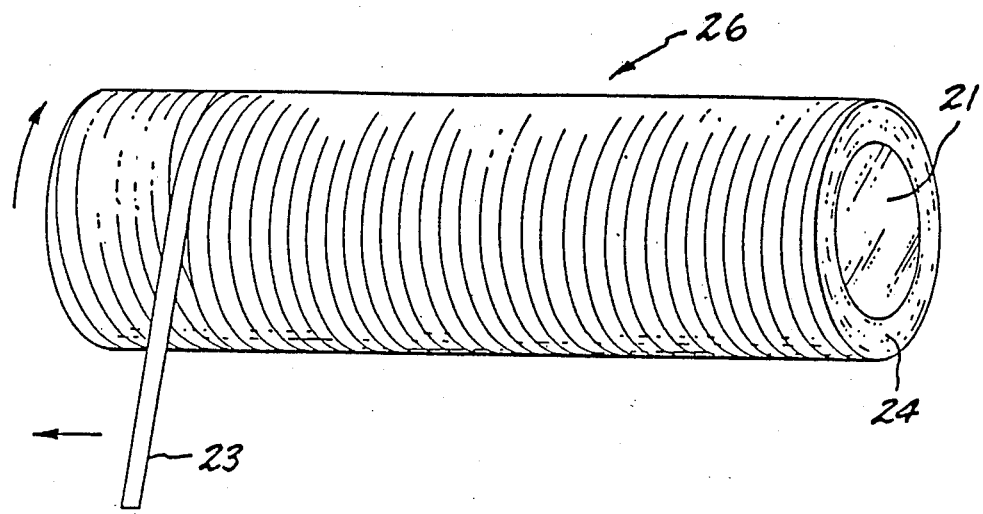
FIG. 3 is a perspective view showing a metal bar being girded by a restraining wrapper.
Figure 4:
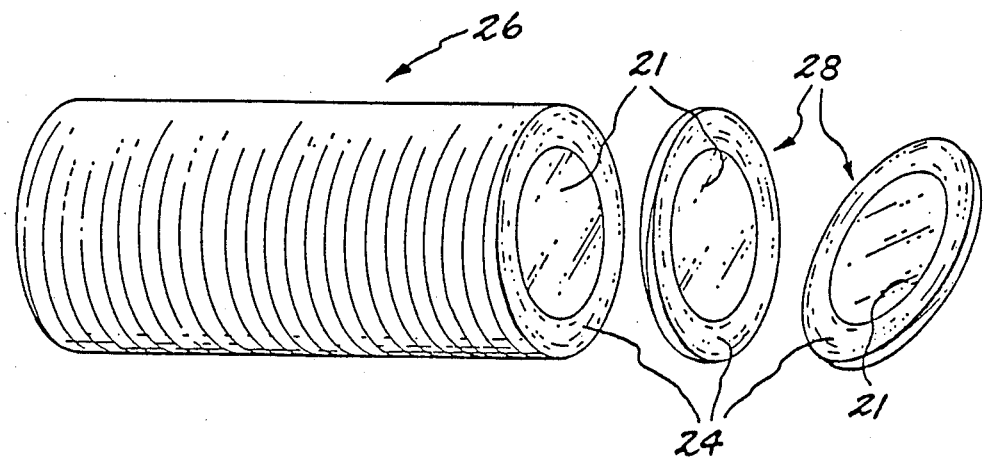
FIG. 4 is a perspective view showing the girded bar of FIG. 3 being sliced into discrete substrate layers.

FIGS. 3 and 4 show a method for constructing a substrate wherein a copper cylinder 21 is circumferentially wound with a carbon fiber tape 23. Tape 23 is subsequently impregnated with an epoxy (not shown) and cured by any one of many known and commercially available processes to form a carbon fiber-epoxy composite wrapper in the form of a hollow cylinder 24 annularly surrounding copper cylinder 21. The resulting wrapped cylinder, indicated at 26, is subsequently sliced, as shown in FIG. 4, into substrate layers 28 of predetermined thickness. Each substrate layer 28 is seen to comprise a portion of copper bar 21 girded by a portion of wrapper 24. Subsequent to slicing a substrate layer 28, a layer of solder is used to bond a semiconductor chip to a flat surface of the substrate layer, thereby forming semiconductor package 10 of FIGS. 1 and 2. Mounting holes (not shown) can optionally be fabricated in wrapper 24, for example by drilling, to facilitate the fastening of a layer 28 to an external mount (not shown). These mounting holes, examples of which are indicated at 22 of FIGS. 1 and 2, can be fabricated in wrapper 24 both before and after layer 28 are sliced from wrapped cylinder 26.

In summary, a new and improved substrate for a semiconductor chip package is provided wherein a restraining wrapper is used to constrain the planar expansion of a metal heat sink, and hence which does not subject a solder layer bond to the low cycle thermal fatigue described above. Also disclosed is a method for making the substrate.

While a preferred embodiment of the invention has been illustrated and described, it will be obvious that it is not so limited. Numerous modifications, changes, variations, substitutions, and equivalents will occur to those skilled in the art without departing from the spirit and scope of the invention. In particular, the materials described are exemplary, their specified characteristics being most important to the successful practice of the invention. Further, while in the preferred embodiment of the invention disc 12 (FIGS. 1 and 2) and bar 21 (FIGS. 3 and 4) have generally circular cross-sections, it will be appreciated by those skilled in the art that the invention is not so limited and could be practiced, for example, with discs or bars of a polygonal cross-section. Finally, while the carbon fiber illustrated in FIGS. 3 and 4 is in the form of tape 23, other forms of fiber such as a filament or tow could be used in its stead, and, depending on the materials used, as little as a single winding layer might suffice to perform the functions described. Accordingly, it is intended that the invention herein be limited only be the scope of the appended claims.

The invention claimed is:

1. A method for fabricating a substrate for a semiconductor chip package comprising:
   providing a metal bar having a high coefficient of thermal conductivity;
   girding the periphery of said metal bar with a restraining wrapper by wrapping at least a single winding layer of a fiber around the periphery of said metal bar;
   impregnating said fiber with an epoxy; and
   slicing at least oen layer of a predetermined thickness from said girded bar, said layer including a portion of said metal bar girded by a portion of said restraining wrapper, said portin of said metal bar including a substantially flat surface for bonding to a semiconductor chip.

2. A method for fabricating a substrate for a semiconductor chip package comprising:
   providing a metal bar having a high coefficient of thermal conductivity;
   girding the periphery of said metal bar with a restraining wrapper comprising a carbon fiber-epoxy composite or a boron fiber-epoxy composite; and
   slicing at least one layer of a predetermined thickness from said girded bar, said layer including a portion of said metal bar girded by a portion of said restraining wrapper, said portion of said metal bar including a substantially flat surface for bonding to a semiconductor chip.

3. The method of claim 2 wherein said metal bar comprises copper (Cu) or silver (Ag).

4. A method for fabricating a semiconductor chip package comprising:
   providing a metal bar comprising copper (Cu) or silver (Ag);
   girding the periphery of said metal bar with a restraining wrapper comprising carbon fiber-epoxy composite or boron fiber-epoxy composite material;
   slicing at least one layer of a predetermined thickness from said girded bar, said layer including a portion of said metal bar girded by a portion of said restraining wrapper, said portion of said metal bar including a substantially flat surface; and
   bonding a silicon (Si) or gallium arsenide (GaAs) semiconductor chip to said flat metal surface using a layer of solder.

* * * * *